United States Patent [19]
Stevens et al.

[11] Patent Number: 5,610,099
[45] Date of Patent: Mar. 11, 1997

[54] PROCESS FOR FABRICATING TRANSISTORS USING COMPOSITE NITRIDE STRUCTURE

[75] Inventors: E. Henry Stevens; Richard A. Bailey; Thomas C. Taylor, all of Colorado Springs, Colo.

[73] Assignee: Ramtron International Corporation, Colorado Springs, Colo.

[21] Appl. No.: 267,278

[22] Filed: Jun. 28, 1994

[51] Int. Cl.⁶ .................................................. H01L 21/283
[52] U.S. Cl. ........................ 437/192; 437/41; 437/195; 437/200; 437/241
[58] Field of Search ...................... 437/190, 192, 437/195, 200, 235, 237, 241, 983, 419 M

[56] References Cited

U.S. PATENT DOCUMENTS

| | | | |
|---|---|---|---|
| 4,556,897 | 12/1985 | Yorikane et al. | 357/71 |
| 4,570,331 | 2/1986 | Eaton, Jr. et al. | 29/576 B |
| 4,587,718 | 5/1986 | Haken et al. | 29/571 |
| 4,657,628 | 4/1987 | Holloway et al. | 156/643 |
| 4,676,866 | 6/1987 | Tang et al. | 156/643 |

(List continued on next page.)

FOREIGN PATENT DOCUMENTS

| | | |
|---|---|---|
| 0151476 | 8/1985 | European Pat. Off. . |
| 0200372 | 12/1986 | European Pat. Off. . |
| 0232508 | 8/1987 | European Pat. Off. . |

OTHER PUBLICATIONS

Scott, David. "Titanium Disilicide Contact Resistivity and Its Impact on 1–μm CMOS Circuit Performance." IEEE Transactions on Electron Devices, vol. ED–34, No. 3, Mar. 1987.

Taur, Yuan. "Source–Drain Contact Resistance in CM:OS with Self-Aligned TiSi2." IEEE Transactions on Electron Devices, vol. ED–34, No. 3, Mar. 1987.

Tang, Thomas. "Titanium Nitride Local Interconnect Technology for VLSI." IEEE Transactions on Electron Devices, vol. Ed–34, No. 3, Mar. 1987.

Chapman, R. A. "High Performance Sub–Half Micron CMOS Using Rapid Thermal Processing." IEEE, 1991.

Tang, Thomas. "BLSI Local Interconnect Level Using Titanium Nitride." International Electron Devices Meeting. Washington D. C., Dec. 1–4, 1985.

Patent Abstract of Japan. Publication No. 1,281,750. Application Date May 7, 1988. Goto Makio. International Class No. H01L21/88. Filing Date Nov. 13, 1989.

Kusters, K. H. "A High Density 4Mbit dRAM Process Using a Fully Overlapping Bitline Contact (FoBIC) Trench Cell.".

*Primary Examiner*—T. N. Quach
*Attorney, Agent, or Firm*—Peter J. Meza, Esq.

[57] ABSTRACT

In fabricating a source/drain electrode of an integrated circuit transistor and a contact window for it: (1) establishing a structure with a window over the source/drain region next to a gate electrode and isolation structure; (2) establishing a dielectric layer covering the isolation structure, the window, and gate electrode; (3) implanting a moderate concentration of impurities into the source/drain region through said dielectric layer so that the moderate concentration region extends partially under the gate electrode; (4) removing the horizontal portions of the dielectric layer with an anisotropic etch thereby leaving the dielectric on vertical side walls; (5) establishing a region of titanium silicide over the moderately dosed source/drain region and establishing a titanium nitride layer over the isolation structure, windows, and gate electrode; (6) establishing a layer of silicon nitride over the titanium nitride layer; (7) implanting the substrate with a relatively heavier dose of ions through the silicon nitride, titanium nitride, and titanium silicide layers to create a heavier concentration source/drain region intersecting said moderate concentration region, where the heavy concentration region does not underlie the gate electrode; (8) patterning the silicon nitride layer; (9) using the patterned silicon nitride layer as a mask to pattern the titanium nitride layer; (10) adding thick interlevel dielectric over the patterned nitride layers; (11) opening windows over the electrodes; and (12) adding contact material in said windows.

11 Claims, 9 Drawing Sheets

U.S. PATENT DOCUMENTS

| | | | |
|---|---|---|---|
| 4,686,000 | 8/1987 | Heath | 156/643 |
| 4,690,730 | 9/1987 | Tang et al. | 156/643 |
| 4,746,219 | 5/1988 | Holloway et al. | 357/23.11 |
| 4,784,973 | 11/1988 | Stevens et al. | 437/200 |
| 4,788,160 | 11/1988 | Havemann et al. | 437/200 |
| 4,811,078 | 3/1989 | Tigelaar | 357/54 |
| 4,821,085 | 4/1989 | Haken et al. | 357/67 |
| 4,826,781 | 5/1989 | Asahina et al. | 437/41 |
| 4,857,141 | 8/1989 | Abe et al. | 156/644 |
| 4,878,994 | 11/1989 | Jucha et al. | 156/643 |
| 4,897,709 | 1/1990 | Yokoyama et al. | 357/68 |
| 4,908,333 | 3/1990 | Shimokawa et al. | 437/195 |
| 4,921,572 | 5/1990 | Roche | 156/653 |
| 4,957,590 | 9/1990 | Douglas | 156/643 |
| 4,977,440 | 12/1990 | Stevens | 357/68 |
| 5,010,032 | 4/1991 | Tang et al. | 437/57 |
| 5,043,298 | 8/1991 | Yamada et al. | 437/52 |
| 5,043,790 | 8/1991 | Butler | 357/68 |
| 5,216,281 | 6/1993 | Butler | 257/750 |
| 5,385,634 | 1/1995 | Butler et al. | 156/644 |

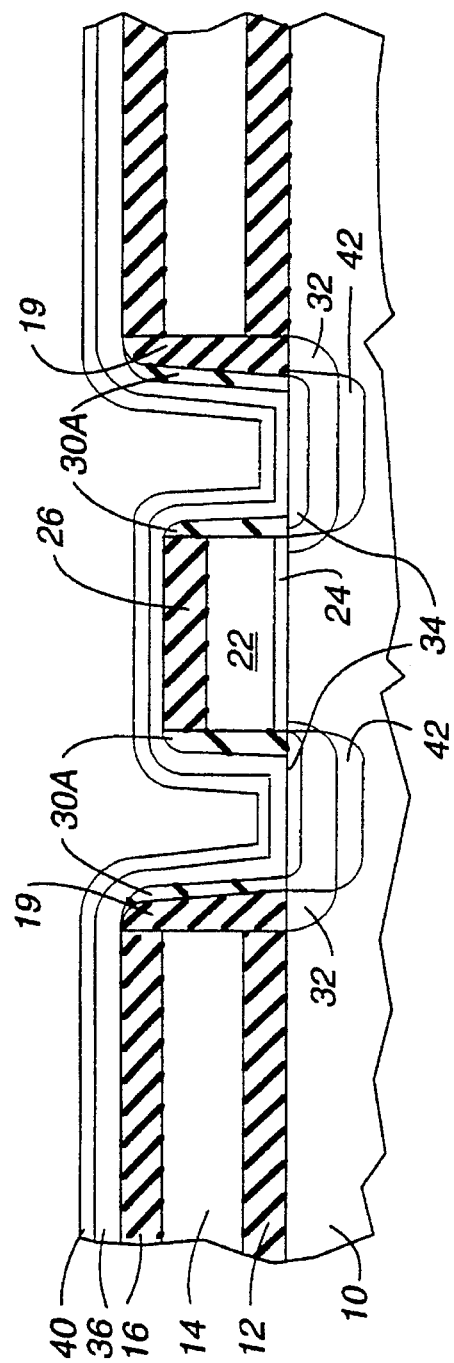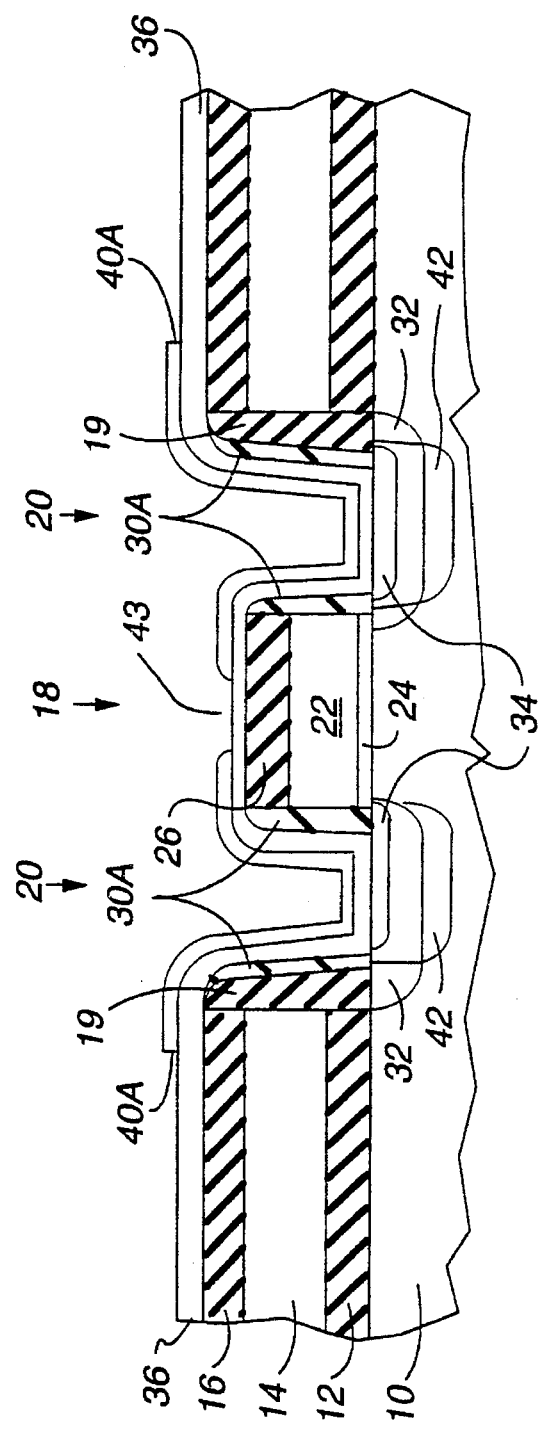
Fig. 2
Fig. 3A

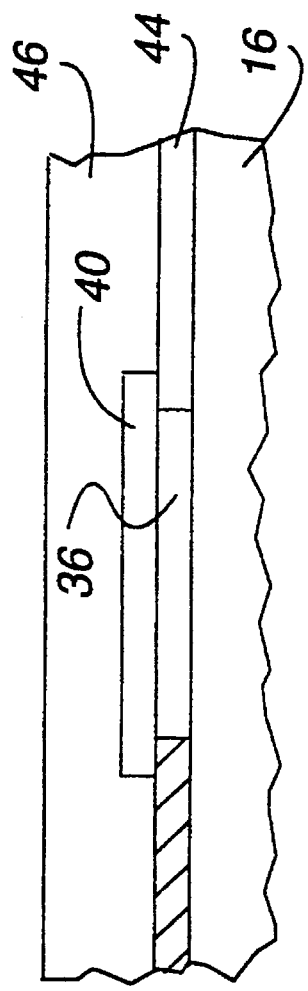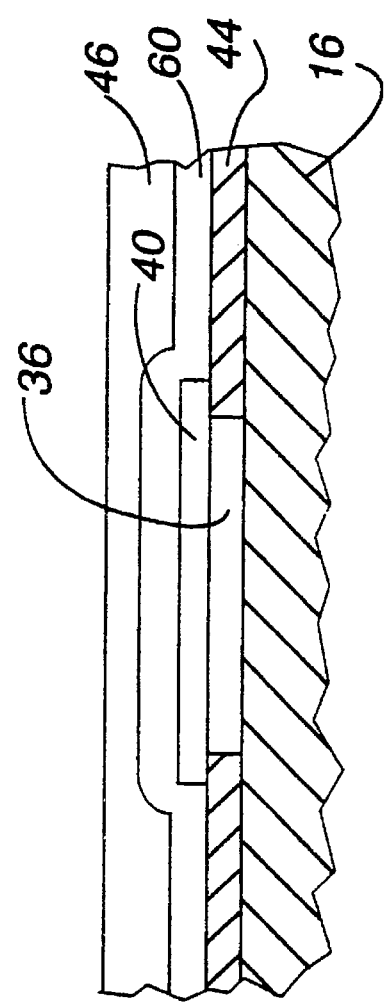

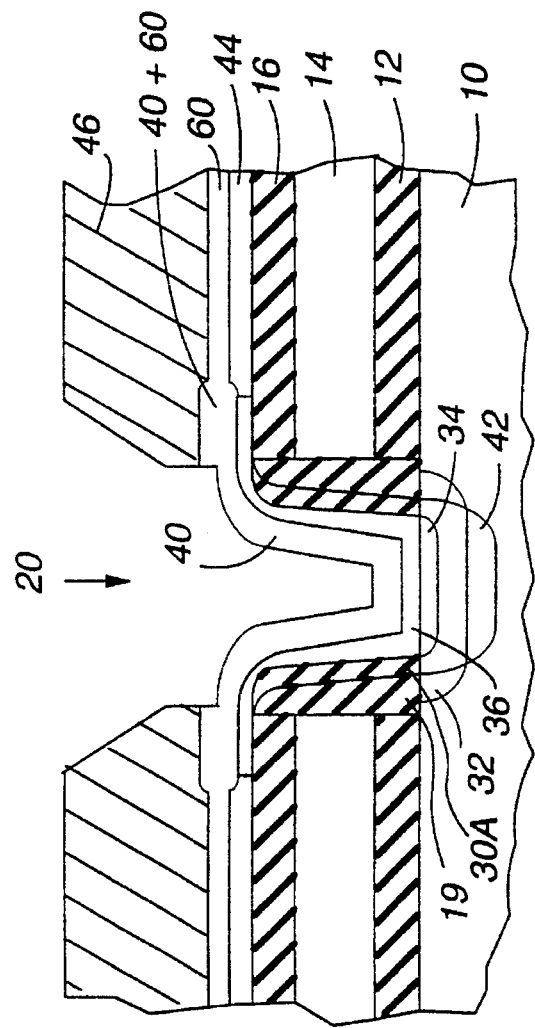
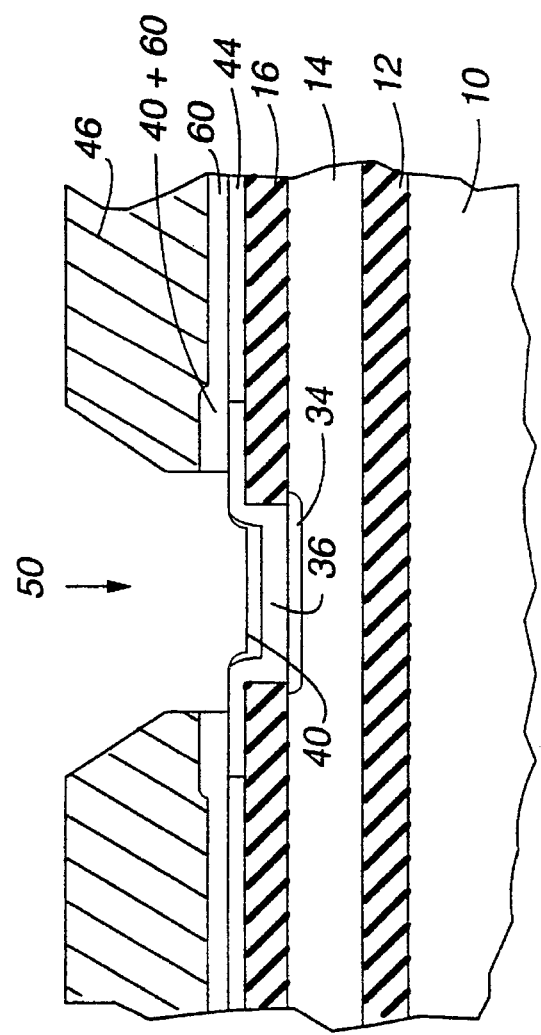

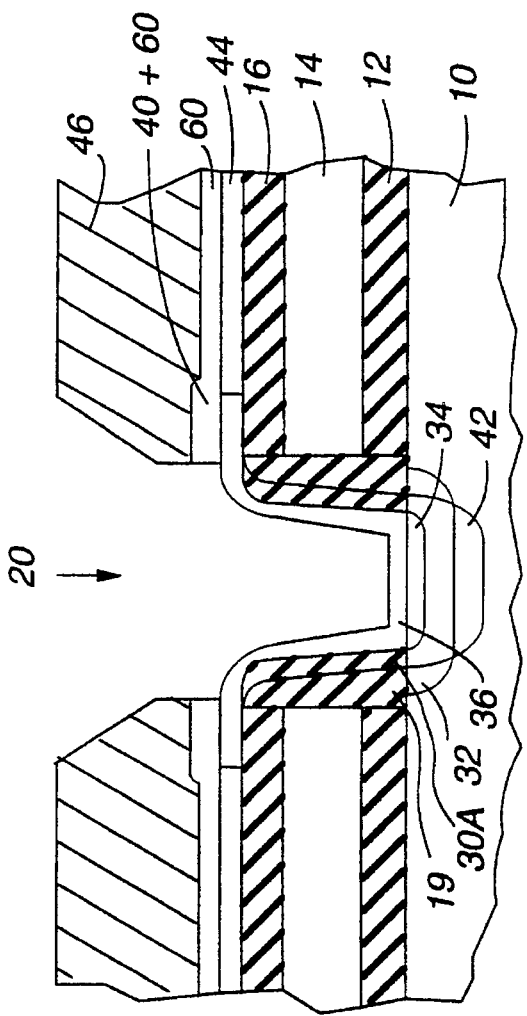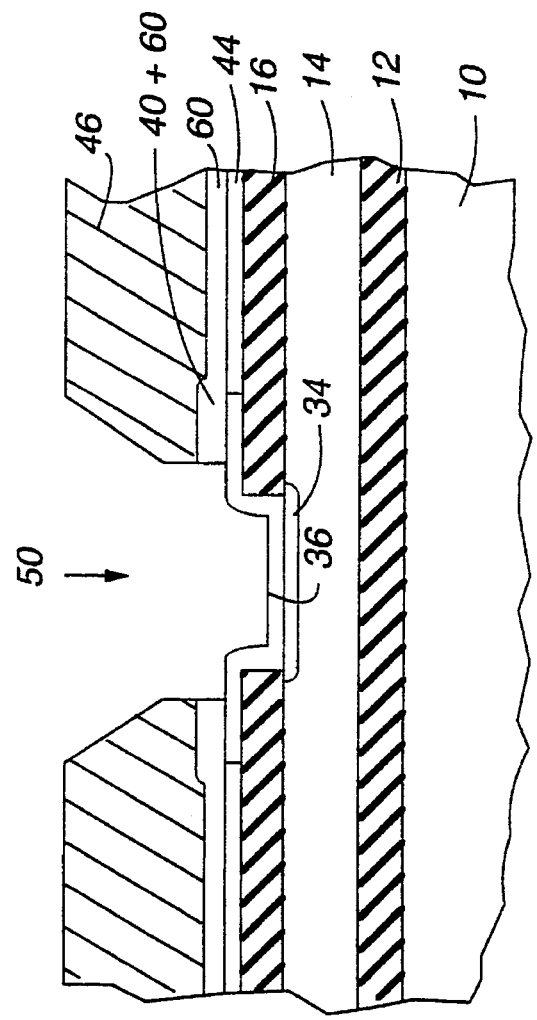
Fig. 9A
Fig. 9B 5,610,099

PROCESS FOR FABRICATING TRANSISTORS USING COMPOSITE NITRIDE STRUCTURE

FIELD OF THE INVENTION

The present invention relates to fabrication processes for manufacturing transistors in integrated circuits, and particularly concerns the formation of contact windows and contacts in such a manner as to block migration of dopants, prevent channeling of implanted ions, and provide accurate spacing of implants relative to nearby structures.

BACKGROUND OF THE INVENTION

While the present invention is not limited to field effect transistors, and may find application in bipolar, CMOS, or other semiconductor technology, reference will be made to field effect transistors, often referred to as NOS transistors. Fundamentally, NOS transistors generally comprise highly doped regions in a semiconductor region with a gate region or channel between the highly doped regions. The highly doped regions are often called source and drain regions. A gate electrode is located above the channel and is sometimes called the "gate". Often, NOS transistors are separated electrically from nearby transistors or other devices by some isolation technique. One prevalent technique involves the use of a relatively thick field oxide. Another technique is a field shield approach. The field shield approach is disclosed, for example, in U.S. Pat. No. 4,570,331, entitled "Thick Oxide Field-Shield CMOS Process, issued on Feb. 18, 1986 to INMOS Corporation upon the application of S. Sheffield Eaton, Jr. and Cheng-Cheng Hu.

In addition to isolating the transistor, for there to be utility, connections must be made to the "electrodes" of the transistor, specifically to the two source/drain regions and the gate electrode.

Metal silicides are known to be effective in making low resistance contacts to source/drain electrodes of N+ doped silicon and for making low resistance bit line interconnects in DRAMs. However, boron from P+ silicon readily migrates from the silicon to the metal silicides to form metal borides. Excessive migration of boron from the sources and drains of p-channel transistors causes CMOS integrated circuits to fail. One object of the present invention, therefore, is to provide against the migration of dopant material in integrated circuit structures.

Second, it is recognized in the semiconductor art that moderately doped regions are useful to join heavily doped source and drain regions of MOS transistors to the channel region which underlies the gate electrode. Extra complexity has been introduced into process flows to allow the formation of such moderately doped regions. It is therefore a further object of the present invention to provide a simple solution to this problem.

Third, MOS transistors used in integrated circuits generally include a relatively thick interlevel dielectric which is added on top of the transistor structure. After the dielectric is in place, at some subsequent time, windows are etched to open the contacts to the transistor source, drain and gate electrodes. Etch processes used to open these contacts tend to damage these electrode regions of the transistor. In consequence, a third main object of the present invention is to provide a structure and process which protects elements of the transistor from such damage due to etching.

It will be understood that the preferred form of the invention involves the use of a titanium nitride (TiN) layer covering a titanium silicide (TiSi$_2$) region that is found in the contact area. This part of the combination is known to the semiconductor industry, and reference may be had to Stevens (one of the present co-inventors), McClure and Hill, U.S. Pat. No. 4,784,973 issued on Nov. 15, 1988 to INMOS Corporation, entitled "Semiconductor Contact Silicide/Nitride Process with Control for Silicide Thickness." That patent explains also that titanium nitride can be used as a metallurgic barrier against reactions between a silicon substrate and an aluminum contact material to a source or drain, for example. The '973 patent discloses a process using a control layer located in the contact opening and formed illustratively of a compound of silicon, oxygen and nitrogen, or silicon oxide. A layer of titanium is added, titanium silicide is formed under the control layer, and titanium nitride is formed above the control layer. It may also be noted, however, that the titanium is added after a relatively thick layer of dielectric such as BPSG (boro-phosphosilicate glass) is established.

By way of further background, an application of the combination of titanium nitride with titanium silicide is discussed by Tang et al. in "VLSI Local Interconnect Level Using Titanium Nitride," International Electron Devices Meeting 1985 (IEDM 85), pp. 590–93. Tang et al. use the titanium nitride for local interconnects.

The present invention has further aspects, however, than merely combining a titanium nitride layer with a titanium silicide region in the contact area. These further aspects are discussed infra.

One of the further objectives of integrated circuit (IC) manufacturing is to increase the functional capability of the IC chip while maintaining the smallest overall chip area and while maintaining process simplicity. Interconnect technology has been a major area of focus in scaling down the overall chip layout. As chip contact size and interconnect design rules are scaled down, new interconnect technologies are needed to maintain reasonable device design features such as contact resistance and interconnect sheet resistance. Furthermore, as design rules shrink, the need for planarized features on the chip is even more important. Thus, new interconnect technologies are needed which are capable of scaling, but which also provide improved contact and interconnect device characteristics, planarization features, and overall cost effective manufacture ability.

The use of metal silicides for application as an interconnect material has been previously disclosed. For example, the use of titanium silicide in a self aligned "salicide" process has been described by Alperin et al. in *IEEE Trans. on Electron Devices*, vol. ED-32, p. 141. Further, using a TiN/TiSi$_2$ clad layer for source and drain moat region salicide formation and using TiN as a local interconnect layer has been described by Holloway et al. in U.S. Pat. Nos. 4,657,628 and 4,746,219, Tang et al. in U.S. Pat. Nos. 4,676,866 and 4,690,730, and by Havemann et al. in U.S. Pat. No. 4,788,160. These patents also specifically describe: the elimination of buried contacts in SRAM design, control of N+ and P+ dopant migration through the local interconnect layer, a diffusion barrier to aluminum metalization, and a field area overlap and contact etch stop feature. The subject matter of the present invention, while including all of the advantages cited by Holloway et al., Tang et al., and Havemann et al., is a further enhancement of the art.

The salicide structures shown in Holloway et al., Tang et al., and Havemann et al. have a TiSi$_2$ layer as a primary conductive layer shunting the polysilicon gate or other doped source, drain, or moat areas. TiN (which is electrically conductive) is used primarily as a local interconnect to strap silicided circuit features. The structures depicted in the drawings in these patents rely heavily on both $TiSi_2$ and TiN as conductive layers. The dependence on $TiSi_2$ as a primary conductive layer in this structure imposes severe limitations on its use in conjunction with a subsequent high temperature reflow process.

Holloway et al., Tang et al., and Havemann et al. all disclose similar means for the formation of the $TiSi_2$ or $TiN/TiSi_2$ clad layer, i.e. sputter depositing a 600 Å to 2000 Å titanium layer, annealing at 500° C. to 750° C. in nitrogen for up to 90 minutes, photo patterning, and etching by a dry/wet etch process to remove unwanted TiN. Variations on this procedure include depositing an oxide hard mask layer such as TEOS oxide over the deposited Ti, patterning the hard mask layer, and then annealing in nitrogen and argon to react the titanium to form the $TiSi_2/TiN$ clad layer. All of these procedures produce a $TiSi_2$ layer which is generally greater than 1000 Å in thickness.

The thickness of the $TiSi_2$ layer is critical because of two possible adverse problems which can occur during a high temperature anneal: dopant segregation and agglomeration. A high temperature anneal at temperatures from 850° C. to 920° C., commonly referred to as a reflow process, is widely used in the industry to flow a BPSG or PSG doped oxide film and provide planarization over the underlying topography.

Dopant segregation at the $TiSi_2$ to P+ or N+ interface can cause severe contact resistance problems. Results reported by Scott et al. in *IEEE Trans. on Electron Devices*, vol. ED-34, p. 562 conclude that the post silicide processing temperature must be kept at or below 700° C. to avoid contact resistance problems with $TiSi_2$ to boron P+ junctions and $TiSi_2$ to phosphorus N+ junctions. Scott et al. conclude that 900° C. post silicide processing is compatible with only arsenic doped N+ junctions and is completely incompatible with boron doped junctions. Scott et al. discloses depositing a 1000 Å Ti film over P+ and N+ junction areas and annealing to form $TiSi_2$ layers (thicknesses were not reported).

In a study by Y. Taur et al., *IEEE Trans. On Electron Devices*, vol. ED-34, p. 575, however, contact resistivities of $3 \times 10^{-7}$ and $1 \times 10^{-6} \Omega.cm^2$ were obtained for $TiSi_2$ to N+ and $TiSi_2$ to P+ contacts respectively if the interface dopant density was maintained at $1 \times 10^{20}/cm^3$. Taur et al. disclose that reasonable contact resistance can be obtained following a 900° C. post silicidation anneal if a minimal amount of the silicon junction is consumed during $TiSi_2$ formation. Taur et al. uses a 350 Å to 500 Å titanium film deposited over P+ and N+ junction areas and annealed to form $TiSi_2$ layers ($TiSi_2 < 800$ Å thickness).

Agglomeration of the $TiSi_2$ layer during a high temperature anneal is another problem. Agglomeration can cause a large increase in silicided source/drain sheet resistance or polycide sheet resistance and can lead to excessive junction leakage or gate oxide degradation. Thicker $TiSi_2$ layers appear to be more resistant to sheet resistance increases caused by $TiSi_2$ agglomeration. But thicker $TiSi_2$ is also more likely to cause junction leakage problems unless the underlying P+ and N+ junctions are deep (approximately 2× the $TiSi_2$ thickness). Thicker $TiSi_2$ is also more likely to degrade gate oxide in silicided poly gate structures unless the underlying polysilicon is thick. Thus, scaling limitations may exist in the devices described in Holloway et al., Tang et al., and Havemann et al. as a result of $TiSi_2$ induced junction leakage or gate oxide degradation.

The devices and processes described in Holloway et al., Tang et al., and Havemann et al. are severely limited in their manufacturing application due to dopant redistribution and oxidation during high temperature reflow. Where $TiSi_2$ is used as a primary conductive layer, a relatively thick (>1000 Å) $TiSi_2$ layer must be used in order to maintain low sheet resistance. There is no other provision made for application in a high temperature reflow environment except avoiding the use of $TiSi_2$ to P+ contacts at high temperature (900° C.) or restricting use of the application to low temperature (700° C.). Further, use is restricted to a nonoxidizing ambient (nitrogen or argon) during a subsequent anneal. This is less desirable than the preferred practice in the industry of using an oxidizing ambient to enhance the reflow and desification of overlying BPSG or PSG glass layers. Furthermore, in the case of a low temperature application, expensive or unusual means must be used to achieve planarization, such as deposition and etchback planarization, or a low temperature high pressure anneal in nitrogen as described by Chapman et al. in *IEDM Technical Digest* 1991, p. 101. Therefore, it is a general object of the present invention to provide an improved structure and process which overcomes these limitations in the art.

Previously, Stevens in U.S. Pat. No. 4,977,440 disclosed a $TiSi_2/TiN$ structure to provide low contact resistance, a metallurgical barrier, interconnect regions, and improved mechanical strength to wire bonding. Although Stevens uses $TiSi_2/TiN$ over contact areas, the structure also includes aluminum over TiN regions. Since aluminum is not a refractory material, Stevens' structure should not be used in a high temperature reflow application. Thus, Steven' structure is not appropriate for use in a buried local interconnect application.

Butler, U.S. Pat. No. 5,043,790 discloses a contact structure wherein a conductive nitride layer is located within the contact region and a first dielectric is located partially inside and partially outside of the contact region. A sidewall of another dielectric is located outside of the conductive nitride layer so that a conductive material can be located within the contact region to be electrically coupled to one electrode but not another, even when the conductive material extends outside the contact region and over the electrode to which contact is not to be made. This is accomplished through widening the contact region using a dry etch followed by a wet etch. Butler, U.S. Pat. No. 5,216,281 discloses another embodiment of this structure.

The present invention is an improvement over the structure of Butler and the other cited references.

SUMMARY OF THE INVENTION

The present invention has many aspects which will be understood from studying the description of the preferred embodiment, infra. However, it may generally be stated that according to some aspects of the invention, a layer of a transition metal nitride, preferably titanium nitride (TiN) is formed over the transistor source, gate electrode, and drain regions. Preferably, a blanket layer of titanium nitride is formed which covers the top and sides of the gate electrode, and the bottom and side walls of the openings for the source and drain regions. The TiN layer is used as a local interconnect layer buried beneath a thick dielectric layer to interconnect device structures such as the source and drain or gate of an MOS transistor to electrodes of another MOS transistor or other IC circuit components, for example, capacitor plates or diffused resistors. Where field shield isolation is provided, the nitride layer also preferably covers the top surface of the field shield isolation transistors. This nitride layer is one element of a composite nitride structure.

A second element of the composite nitride structure used in the present invention is a second nitride layer formed on top of the first nitride layer. Preferably, the second nitride layer is formed directly on top of and in contact with the first nitride layer. Preferably the second nitride layer comprises or constitutes silicon nitride ($Si_3N_4$). Accordingly, in the preferred embodiment the silicon nitride layer is used in conjunction with a titanium nitride layer to form a $Si_3N_4$/TiN composite layer in source/drain regions or resistor contact regions of the IC device. Further, a two layer composite structure of $Si_3N_4$/TiN is formed on the sidewalls and preferably over the top of the gate electrode. Preferably, the composite is added prior to establishing a relatively thick interlevel dielectric over the environs.

In an embodiment of the present invention, a spacer is provided between the gate electrode sidewall and the TiN or first layer. The spacer may comprise a dielectric such as silicon dioxide or silicon nitride.

According to another aspect of the invention, the composite structure preferably includes a third layer which is located only where the composite traverses a source or drain region. Thus, a third layer, which is preferably titanium silicide, is created as a lowermost layer. Typically, the titanium silicide will form in the substrate itself extending downward from the top surface of the substrate in the designated source/drain region, and extend into the substrate but not nearly as far as the source/drain region extends into the substrate.

One beneficial effect of the second nitride layer, which is preferably silicon nitride, is to prevent oxidation of the first nitride layer. This occurs where the second nitride layer is silicon nitride and the first nitride layer is titanium nitride. A further advantage of this combination is that in the process flow, the second nitride layer is patterned without affecting or defining the first nitride layer. In a subsequent step, the patterned second nitride layer is used to create the same pattern in the first nitride layer. Alternatively, after the second nitride layer is patterned, those portions of the first nitride layer which become exposed by such patterning of the second layer are not removed but instead are converted into a different substance. For example, where the first nitride layer is titanium nitride, those portions of the first nitride layer which become exposed when the second nitride layer is patterned are oxidized into one or more compounds having the general formula $Ti_xN_yO_z$ (a compound comprising less than 1% TiN and greater than 99% $TiO_2$ or other polymorphic forms of titanium oxide).

After the first and second nitride layers are thus processed, a further layer of nitride, preferably silicon nitride, may be deposited, then a relatively thick dielectric film may be added. At some time thereafter, contact windows to the source/drain regions can be defined and etched. The composite nitride structure protects the side walls of the contact window, protects the source and drain regions, and thus allows self-alignment. Similarly, a contact window to the gate electrode is etched through the thick dielectric on top of the composite layer, and the nitride composite protects against the etchant inadvertently etching to the source/drain region.

It will be appreciated that the silicide in the source/drain region promotes a low resistance contact to those parts of the transistor. The first nitride layer overlying the source/drain regions fosters the safe use of bit line interconnects made of doped polysilicon or metal silicides, because the first nitride layer effectively blocks migration of dopant between the source/drain region and the bit lines. The composite structure of the first and second nitride layers also prevents channeling of ion implants which are used to form the source and drain regions. Additionally, this composite provides a spacer to keep the implants sufficiently away from the transistor gate edge, thus providing the moderately doped region referred to supra. In addition, the first nitride layer, preferably titanium nitride, can be used to interconnect devices.

Additional features of the present invention include the ability to optimize film thicknesses independently to meet design or process requirements. For example, the thickness of the TiN layer can be increased to reduce sheet resistance of the interconnect layer or to improve the etch stop capability of the TiN layer. The silicon nitride layer thickness can also be adjusted to further enhance the etch stop capability of the $Si_3N_4$/TiN stack. For application as an implant sidewall spacer, both $Si_3N_4$ and TiN films may be adjusted to provide the control of sidewall spacer width.

BRIEF DESCRIPTION OF THE DRAWINGS

In describing a preferred embodiment of the present invention, reference is made to accompanying drawings wherein:

FIG. 2 illustrates the structure of FIG. 1 at a subsequent processing stage after the first and second nitride layers have been formed, and after the third layer has been formed in the source/drain regions;

FIG. 3A illustrates the structure of FIG. 2 after the second nitride layer has been defined;

FIGS. 5A and 5B are sectional views or representations at a point which is displaced from the sections of FIGS. 1, 2, 3 and 4; FIG. 5A depicts the gate electrode structure just prior to the deposition of a transition metal; FIG. 5B depicts the gate electrode structure at the same process step as shown in FIG. 3.

FIGS. 6A and 6B relate to FIGS. 1–5;

FIG. 8A illustrates the structure of FIG. 7A wherein a contact window is defined and partially etched for a sufficient etch time as to remove the entire thickness of the oxide in the source/drain region;

FIG. 8B illustrates the structure of FIG. 7B wherein a contact window is defined and etched for the same amount of time as FIG. 8B so as to remove the entire thickness of the oxide and most of the layer of silicon nitride;

FIG. 9A illustrates the structure of FIG. 8A wherein a portion of the titanium nitride is removed; and FIG. 9B illustrates the structure of FIG. 8B wherein a portion of titanium nitride is removed.

DETAILED DESCRIPTION OF THE PRESENTLY PREFERRED EMBODIMENTS

Figure 1:
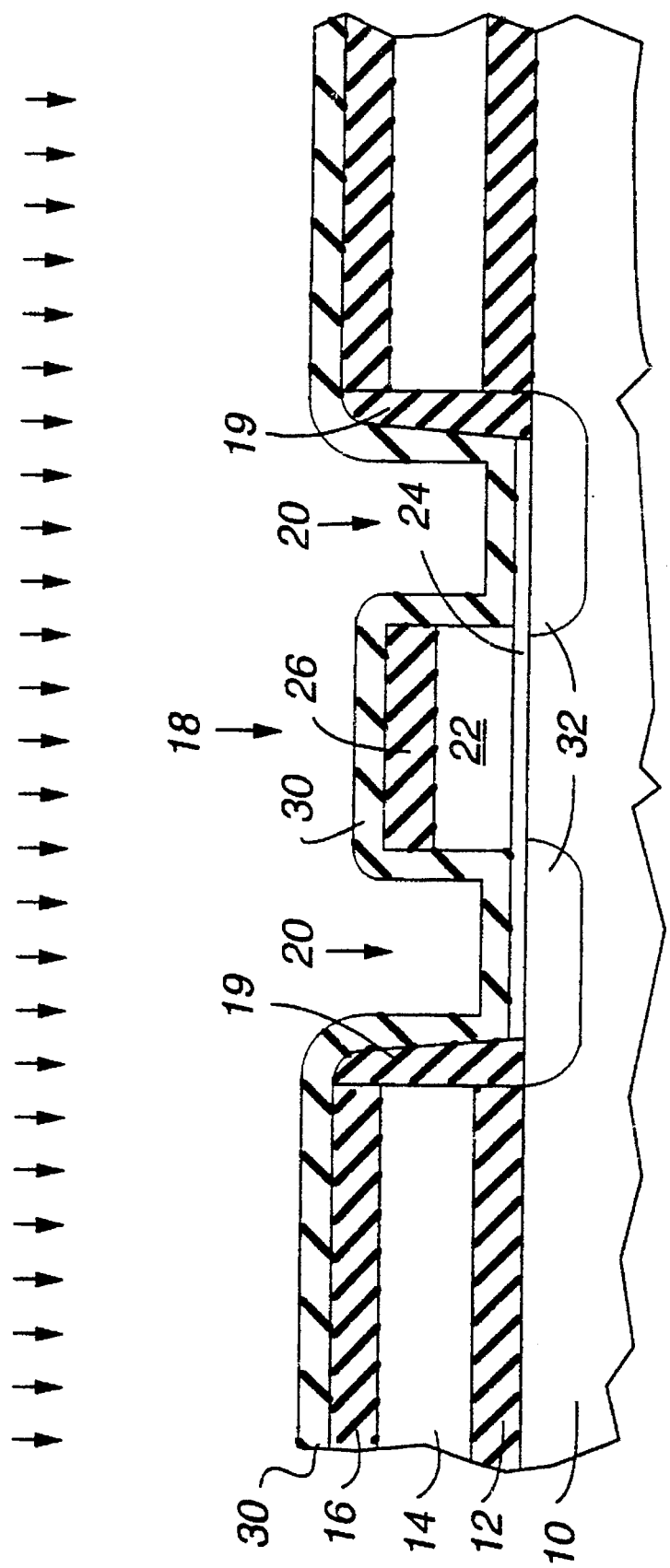
FIG. 1 represents a sectional view of a partially formed transistor between two field-shield isolation transistor structures in an integrated circuit, in a process according to the present invention.

Referring to FIG. 1, a field effect MOS transistor between two field shield isolation transistors is depicted in a sectional representation. This view represents an intermediate step during formation of an integrated circuit, other parts of which are not shown in FIG. 1. As shown, a substrate 10 is a semiconductor wafer, preferably of a suitably doped single crystal silicon. It will be understood that the silicon can be lightly doped. Further, an expitaxial layer can be included. Substrate 10 is intended to be representative as are other portions of the transistor. Dielectric 12 is preferably silicon oxide having a thickness on the order of 500 Å to 1000 Å deposited upon or grown upon the top surface of substrate 10.

Above oxide 12 is a field shield gate electrode 14 which is preferably polycrystalline silicon ("polysilicon") having a thickness typically on the order of 1000Å to 4000 Å. A dielectric 16 is shown above and in contact with the field shield gate electrode 14. Dielectric 16 is formed illustratively of silicon oxide or silicon nitride and has a thickness on the order of 1000 Å to 3000 Å. Elements 12, 14 and 16 have their sidewalls aligned to form a common vertical sidewall. Along the sidewall of elements 12, 14 and 16 is a dielectric spacer 19 which forms a vertical, or nearly vertical, edge and is preferably comprised of a silicon dioxide or silicon nitride material having a thickness on the order of 1500 Å to 2500 Å. It will be seen that such a structure appears on the left and right sides of FIG. 1. These structures provide field shield isolation transistors so that the gate electrodes thereof can be grounded to turn the field shield isolation transistors off. It will be understood that field oxide could be used instead of the superior field-shield technique. In general, the element next to the region to which contact is to be made is not limited by the present invention—and may comprise isolation or other structures.

The MOS transistor is formed between the exemplary field shield isolation transistors. Accordingly, a gate electrode general structure 18 is shown in the center of FIG. 1. Beside gate electrode structure 18 are windows 20. Gate electrode structure 18 comprises a gate electrode 22 preferably formed of doped polysilicon. Beneath electrode 22 is a relatively thin dielectric 24, usually silicon oxide, having a thickness on the order of 100 Å through 400 Å. Thus, it will be seen that dielectric 24 isolates gate electrode 22 from the upper surface of substrate 10. On top of gate electrode 22 is a further dielectric 26 formed preferably of silicon oxide or silicon nitride having a thickness on the order illustratively of between 1500 Å and 4000 Å. Further elements may be included in the gate electrode structure 18.

Source/drain regions 32 are shown beneath windows 20. These are formed by dopants that have been preferably implanted at a moderate dose. The arrows at the top of FIG. 1 indicate that doping by ion implantation has occurred. Preferably, source/drain regions 32 are doped to concentrations in the range of $10^{17}$ to $10^{19}$ ions per cubic centimeter forming the first part of a lightly doped drain or graded drain structure. This can be accomplished by implanting ions at a suitable energy and dose through dielectric layer 24. Optionally, a short oxidation cycle may be incorporated just prior to the step of ion implantation to provide a small oxide spacer (typically less than 1000 Å) along the sidewall of gate electrode 22 and to increase the thickness of dielectric layer 24 in contact windows 20. The short oxidation cycle, or the result thereof, is not shown in FIG. 1.

Preferably, dielectric layer 24 is amorphous and prevents channeling of implanted ions along preferred directions in the underlying single crystal silicon substrate 10. The thickness of dielectric layer 24, the implant energy and the subsequent anneals are selected so that the depth of the moderately doped source/drain regions 32 will be typically in the range of about 1500 Å to 2500 Å, while the extension of the moderately doped source/drain regions 32 under gate electrode 22 will be in the range of about 500 Å to 1000 Å. As is well known in the art, the extent of source/drain region 32 under the edge of gate electrode 22 must be optimized to prevent excessive damage due to hot carrier phenomena and to minimize gate to drain overlap capacitance.

A layer 30 is then deposited over the entire structure. Preferably, layer 30 is a dielectric material which comprises silicon oxide or silicon nitride having a thickness illustratively of 500 Å through 3000 Å. It will be seen that dielectric layer 30 covers the top surface of dielectric 16, the side walls of windows 20, including the side walls of the gate electrode structure 18, and covers the upper surface of layer 24.

At this point, high dose implants of boron, arsenic, and phosphorus may then be used to form highly doped regions in the source/drain regions, providing a second or highly doped part of a lightly doped drain ("LDD") or graded drain structure, as is well known in the art. In a preferred embodiment of the present invention, the high dose implants are formed during a later process step (see regions 42 in FIG. 2, infra).

FIG. 2 shows the structure of FIG. 1 at a subsequent processing stage. The structure of FIG. 1 is subjected to an isotropic etch to remove the horizontal portions of dielectric layer 30 and underlying portions of dielectric layer 24. It will be seen in FIG. 2 that only the vertical remnants or portions 30a of layer 30 remain, and these are on the side walls of windows 20.

Next, a layer (not shown in FIG. 1 or 2) of a transition metal, preferably titanium, is deposited or otherwise established over a first region which comprises the entire structure of FIG. 1. This can be added by sputtering, for example. This structure is then annealed or reacted at an elevated temperature in a nitrogen-containing atmosphere. Illustratively, this step may occur at a temperature of 550° C. in an atmosphere of nitrogen, ammonia, or a mixture of nitrogen and hydrogen (typically less than 10% hydrogen). The oxygen content of the ambient atmosphere is preferably kept extremely low. Consequently, where the titanium contacts the source/drain region, it reacts with the silicon of substrate 10 to form a titanium silicide 34 region. The titanium layer forms a titanium nitride layer 36 above the titanium silicide region 34 and in all other areas where the titanium was deposited (a "first region"). It will be noted that the titanium nitride layer is thinner over the source/drain regions than elsewhere because part of the titanium in those regions has reacted with the silicon of the substrate 10. After reacting the titanium, the titanium nitride layer 36 can be made thicker if desired by reactively sputtering titanium in a chamber containing nitrogen ions to form additional titanium nitride. The ultimate thickness of layer 36 is preferably in the range of 200 Å to 2000 Å, and the thickness of silicide in region 34 is in the range of 100 Å to 200 Å.

In an embodiment of the present invention, a thin layer of Ti (<300 Å) is preferably deposited to form the initial TiN/TiSi$_2$ layer in the exposed silicon regions. As a result, the initial TiN layer formed by this process is also very thin (<250 Å). If a relatively thick second layer of Ti (approximately 1000 Å) is deposited over the first TiN layer and annealed, as in the prior art, some unreacted Ti will result where a relatively low temperature anneal (approximately 600° C.) is used to form the TiN. If a high temperature anneal is used to form the TiN, there will be a breakdown of the underlying TiN to allow formation of additional TiSi$_2$ in the source/drain or other exposed silicon regions. If unreacted Ti is present just prior to the high temperature reflow anneal, additional TiSi$_2$ will form in a rather uncontrolled manner. The unreacted Ti will provide a path for Si diffusion in the TiN interconnect structure which will result in a titanium based material forming over the oxide regions. The resulting material, which is some compound of titanium, with silicon, nitrogen, or oxygen, is extremely difficult to remove by either wet chemical or dry plasma etching. The formation of this unwanted titanium based material over oxide regions will cause conductive stringers (i.e. unwanted conductive filaments which remain following an etch and often will short together circuit elements and render an IC chip nonfunctional) to remain following photo patterning and etch which will short out the IC circuit devices. This unwanted material formation is a known common hazard associated with a self-aligned silicide or salicide process.

In contrast, in this embodiment of the present invention, an initial layer of TiN (over the oxide regions) or TiN/TiSi$_2$ (over the source/drain or resistor areas) is formed by depositing a thin layer of titanium, approximately 300 Å or less, and then annealing in a nitrogen or an ammonia ambient at 500° C. to 700° C. The thin TiSi$_2$ layer 34 formed in the source/drain or poly areas is used essentially only as a means of eliminating the thin native silicon oxide layer on silicon which would prevent good ohmic contact between the TiN and doped silicon. The thin native oxide layer is eliminated by the titanium reacting with the native oxide layer to form TiSi$_2$ or a compound Ti$_x$Si$_y$O$_z$ which is conductive. Next, a reactively sputtered TiN layer 36 is deposited, with a thickness of approximately 500 Å to 2000 Å, over the initial TiN/TiSi$_2$ layer to a thickness required to meet certain design or process requirements. The reactively sputtered TiN film does not substantially react with the thin initial TiN layer. However, the initial thin TiN or TiN/TiSi$_2$ layer provides an essential stress relief/adhesion layer to the subsequent reactively sputtered (amorphous) TiN film and substantially improves adhesion of the reactively sputtered TiN film during the high temperature anneal.

The judicious use of TiN and TiSi$_2$ materials as incorporated into doped transistor structures is an enhancement over the prior art. As previously stated, the thickness of TiSi$_2$ films is critical when used in conjunction with high temperature processing due to the adverse effects of dopant segregation and agglomeration. First, to control dopant segregation, the TiSi$_2$ layer 34 is made very thin, typically 200 Å or less. The amount of dopant which redistributes into the TiSi$_2$ is controlled or minimized by making the volume of the TiSi$_2$ as small as possible. In addition, by making the TiSi$_2$ layer 34 very thin, the silicide interface to P+ or N+ junction occurs at a point where the dopant in the junction is at or near its maximum concentration. A high dopant concentration at the silicide interface (greater than $1\times10^{20}$ atoms/cm$^3$) is required in order to achieve low contact resistance to P+ and N+ junctions. By incorporation of very thin layers of TiSi$_2$ (200 Å or less), the structure of the present invention maintains good contact resistance to P+ and N+ doped regions even after high temperature annealing. Furthermore, the use of thin TiSi$_2$ films is favorable in the scaling of transistor P+ or N+ junctions or gate poly structures since the risk of silicide induced junction leakage or gate oxide degradation is minimized.

Figure 4:
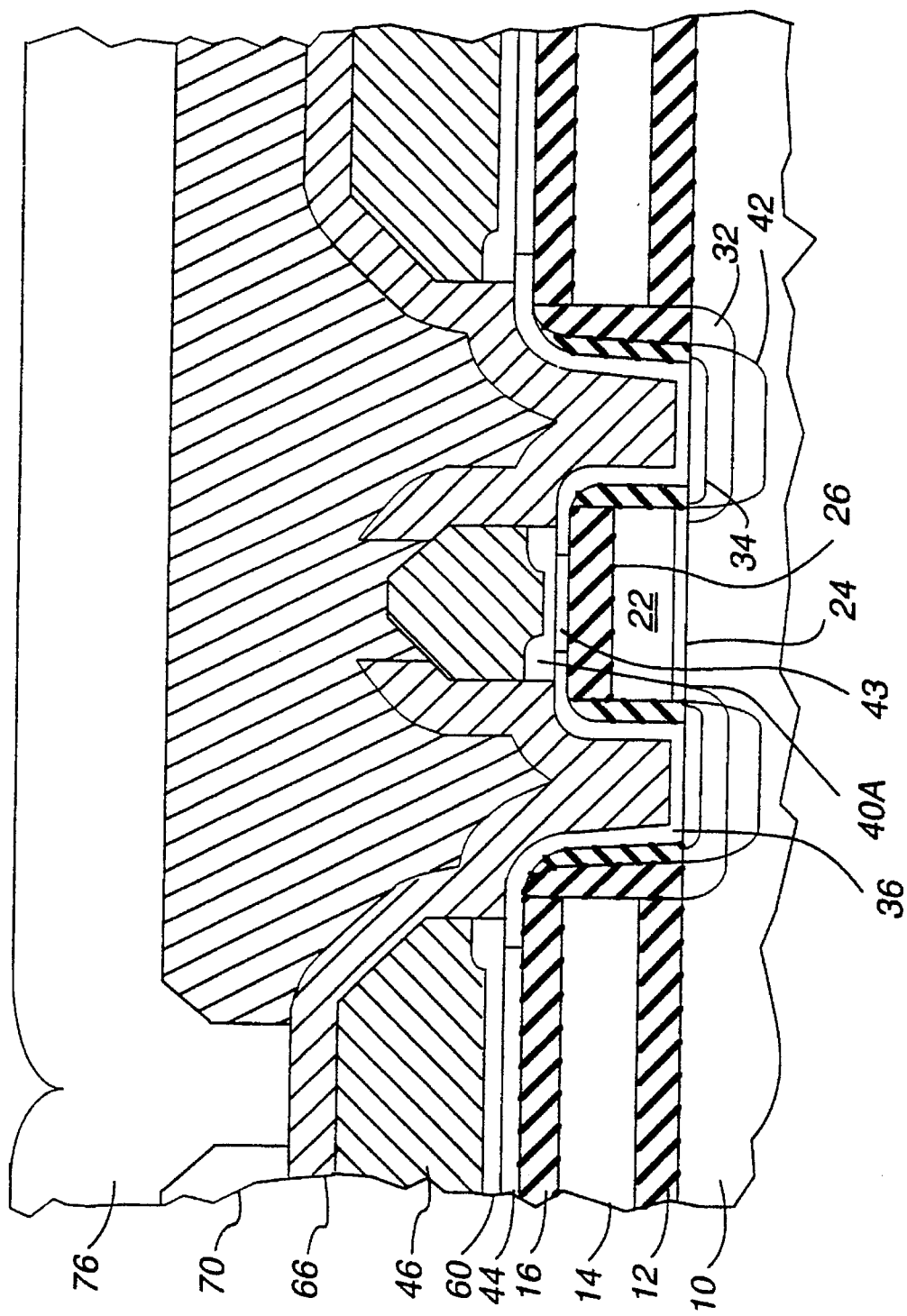
FIG. 4 illustrates the structure of FIG. 3B after a refractory metal interconnect layer has been deposited and patterned, an additional dielectric layer has been deposited, vias patterned, and a final interconnect layer deposited and patterned.
Figure 5A:
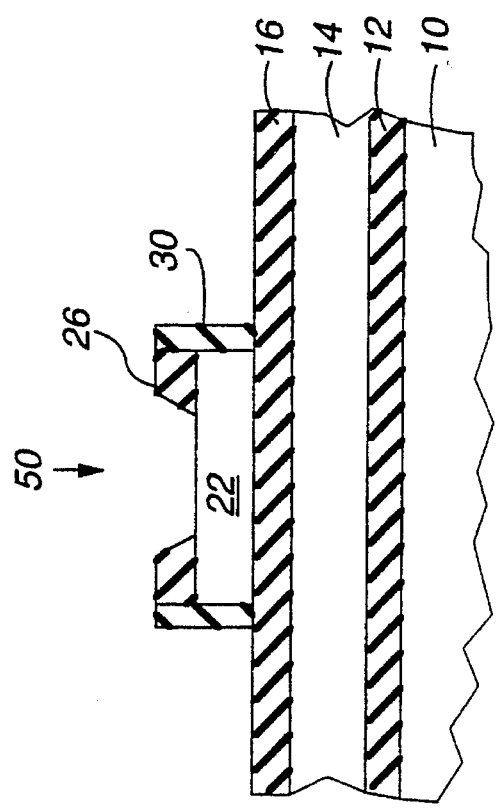
FIGS. 5A and 5B illustrate a structure according to the present invention showing how contact is made to the gate electrode.
Figure 5B:
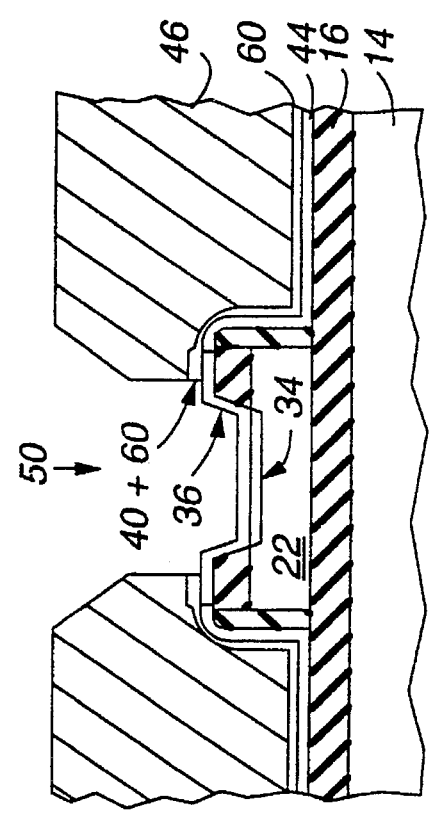

To deal with the TiSi$_2$ sheet resistance increase which typically occurs due to silicide agglomeration at high temperature, TiN is used everywhere as the primary conductive layer. Discontinuities in the TiSi$_2$ layer caused by agglomeration are negated by the use of TiN as a shunting layer everywhere in the clad structure. Thus the application in the present invention of the TiN layer 36 as a shunting layer everywhere to the TiSi$_2$ film allows the use of a very thin TiSi$_2$ initial layer 34 in critical doped junction regions. FIGS. 3, 4 and 5B show incorporation of the TiN layer 36 as a shunting layer to the TiSi$_2$ layer 34 over P+, N+, and polysilicon areas. Furthermore, TiN acts as a diffusion barrier to dopants during subsequent anneals. The TiN layer thickness can be adjusted as needed to meet design or other process requirements.

Next a second nitride layer 40 is established on top of the first nitride layer 36, conveniently by a chemical vapor deposition of silicon nitride. Preferably, the second nitride layer 40 is formed of silicon nitride having a thickness of about 200 Å to 1000 Å. Second nitride layer 40 is sometimes referred to as the "upper" nitride layer whereas first nitride layer 36 is sometimes referred to as the "lower" nitride layer.

The use of silicon nitride to encapsulate the TiN interconnect and protect it from oxidation during a high temperature reflow process in a steam or oxygen ambient is another major enhancement of the present invention. In prior methods, a dielectric layer was deposited over the TiN and used as a hard mask layer for photo patterning the TiN. Although silicon nitride was mentioned for use as a hard mask layer, it was not used as a sealing layer to prevent oxidation of TiN along the sidewall of the film. In the present invention, the additional silicon nitride layer is deposited over the TiN (or over TiN plus an oxide masking layer) to seal the sidewall of the TiN structure.

These enhancements provide the means for using a conventional high temperature reflow process (approximately 850° C. to 920° C.) in an oxidizing ambient. Such a reflow process is widely used in the industry as the most effective means of planarization of the wafer surface with a minimum of cost and yield loss.

The next step in the preferred sequence of the process of the present invention is a heavy dose implantation of ions into substrate 10 to form deeper source and drain regions 42. The implantation, represented by arrows at the top of FIG. 2, requires the implant to travel through the upper nitride layer 40, through the lower nitride layer 36, and then through the silicide layer 34 prior to reaching substrate 10. The upper and lower nitride layers 40 and 36 prevent channeling of the implanted ions along preferred directions in the silicon because layers 36 and 40 are amorphous. Additionally, these layers 36 and 40 in combination provide a further space between the sides of the deep source/drain implants 42 and the (side) edge of gate electrode 22. As noted, this space prevents transistor damage due to hot carrier phenomena. The concentration of deep source/drain regions 42 is on the order of $10^{19}$ to $10^{21}$ per cubic centimeter. The junction or interface between the source/drain implants 42 and the silicon substrate 10 is preferably approximately 2000 Å through 3000 Å below the top surface of substrate 10.

This processing results in the structure shown in FIG. 2, which illustrates a field effect transistor positioned between two isolation structures, one on each side. Windows 20 to the source/drain regions have a vertical or nearly vertical sidewall stick 30a formed of a dielectric such as silicon oxide or silicon nitride. A first nitride layer 36 blankets the first region, which includes the isolation structures, the windows, and the gate electrode structure. A second nitride layer 40 rests upon the upper surface of the first nitride layer. Below the composite created by these two layers, but only in the source/drain regions, a third layer 34 of silicide has been established.

The structure of FIG. 2 is now processed as follows. Using well known photolithographic and etching procedures, the upper nitride layer 40 is removed except over the windows 20 or over regions to be used as a local interconnect as shown in FIG. 3A. It will be seen that portions of upper nitride layer 40 which remain after the etch cover the bottom and side walls of windows 20, as well as adjacent portions of the horizontal surfaces next to the windows. More precisely, after this patterning step, a portion 40a of the upper nitride layer 40 will still be located over part of dielectric 16 and will partially cover gate electrode structure 18. It will be noted that there is a discontinuity 43 in the upper nitride layer over gate electrode structure 18, as shown in FIG. 3A. Thus, there are two disconnected portions 40a, one for each window 20. After defining the pattern in a photoresist, the upper nitride layer 40 can be etched in a plasma comprising carbon tetrafluoride, oxygen, and nitrogen in the approximate ratio of 2:1:3. To avoid leaving unwanted filaments along the vertical side walls of the windows, the silicon nitride etch is preferably isotropic or nearly isotropic.

Figure 3B:
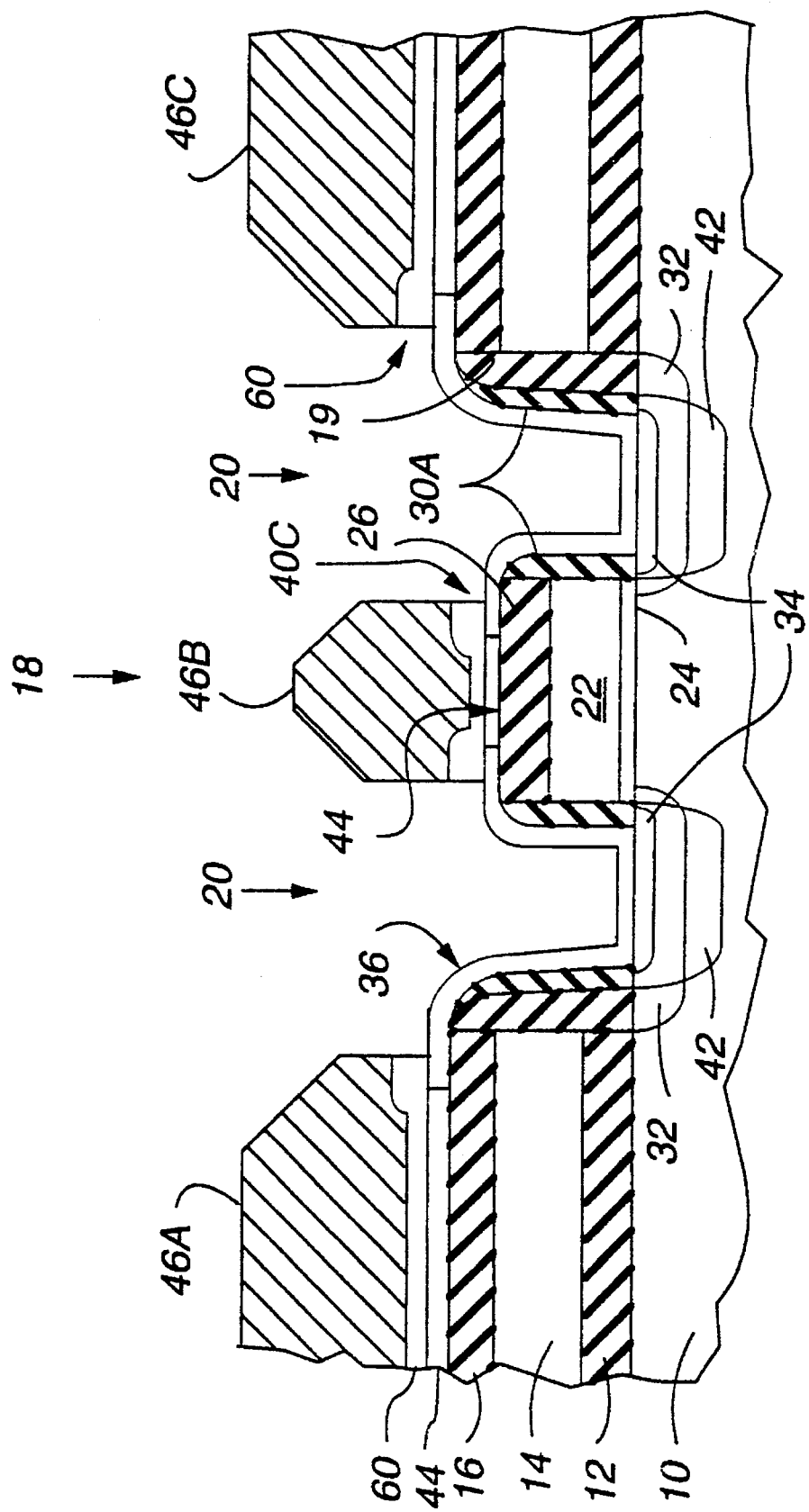
FIG. 3B illustrates the structure of FIG. 3A after the exposed portions of the first nitride layer have been oxidized, the interlevel dielectric has been added, and contact windows have been etched to the source/drain regions.

After patterning upper nitride layer 40, the exposed portions of the lower nitride layer 36 can be converted to electrical insulating regions 44, as shown in FIG. 3B, having a generalized chemical composition $Ti_xN_yO_z$ (a compound comprising less than 1% TiN and greater than 99% $TiO_z$ or other polymorphic forms of titanium oxide) by exposing the structure to an oxidizing atmosphere containing dry oxygen or water vapor at a temperature preferably between 500° C. and 600° C. Details of TiN oxidation in a dry or wet ambient are known in the art and are described in publications such as I. Suni et al., *J. Electro. Chem. Soc.*130 (5), p. 1210 (1983).

After converting the exposed portions of lower nitride layer 36 to insulating regions 44, an additional nitride layer 60, preferably silicon nitride of approximately 200 Å to 2000 Å thick, may be added. Then a relatively thick dielectric layer 46 is deposited over the structure and flowed smooth by a high temperature reflow anneal such as a thermal cycle preferably of between 850° C. and 920° C. a duration of between about 5 minutes to 20 minutes in an atmosphere containing oxygen or water vapor. Preferably, the thick dielectric layer 46 comprises silicon dioxide doped with phosphorus, and boron, or arsenic at suitable concentrations. For example, BPSG which contains 3% to 5% (by weight) boron and 3% to 5% (by weight) phosphorus may be used.

The thick dielectric 46 now may be etched to expose the source and drain regions to which contact is to be made. It will be seen that the side walls of dielectric 46 resulting from this etch terminate on the top surface of upper nitride layer portions 40a and 60. Portions 46a of thick dielectric remain on top of each isolation structure, and a portion 46b remains on top of the gate electrode structure 18, covering the discontinuity 44 in the lower nitride portion 36 over the gate electrode. These openings are to facilitate contacts to the source and drain regions of the transistor. Preferably, the upper nitride portions 40a and 60 which are now exposed by the etching into the thick dielectric layer 46 will also be removed by a suitable etch. Electrical connections to the source and drain can now be made through these windows using interconnect lines of metal, a metal silicide, a doped polycrystalline silicon, or other conductor.

FIG. 4 shows an additional interconnect layer that may be incorporated into the structure of the present invention. If a conductive refractory material 66 is chosen as the interconnect material at this process step, an additional thick dielectric layer 70 may be deposited over the entire structure, and an additional high temperature anneal performed (for reflow or material annealing purposes). Subsequently, vias may be opened through the thick dielectric layer 70, and a final interconnect layer 76 deposited and patterned. The barrier nature of the lower nitride layer 36, which inhibits dopant redistribution, as well as the stable nature of the underlying contact structure in window 20 at reflow temperatures, allows for the use of a refractory metal silicide as an interconnect material 66. In DRAM manufacturing, for example, this would allow for the use of a $WSi_2$ interconnect directly to a P+ contact, or would allow for the use of P+ and N+ contacts to be strapped by a WSi interconnect layer. The use of P+ contacts strapped by a refractory metal interconnect provides a design tool for more efficient chip layout.

It will be appreciated that the same type of structure used to form contacts to the source and drain regions can also be used to form contacts to the gate or other electrodes in the IC circuit. An additional photo masking step and etch, however, may be required to open a contact hole in the dielectric covering the other electrodes. A contact to the poly gate region 22, for example, is shown in FIGS. 5A and 5B. In FIG. 5A, an additional contact opening is made through dielectric layer 26 just after the anisotropic etch (used to remove portions of dielectric layer 30), and just prior to the deposition of titanium or other transition metal. Processing in the gate contact area 50 then proceeds the same as processing described for the source and drain regions, resulting in the structure as shown in FIG. 5B.

As shown in FIG. 6A where the lower nitride layer 36 is patterned by oxidation of the exposed portions thereof, some encroachment of oxidized insulating regions 44 will occur under the edge of the masking upper nitride layer 40. This oxidation encroachment can proceed further during the thermal cycle used to flow the surface of thick dielectric layer 46 since oxygen or water vapor is present in the furnace atmosphere during this thermal cycle.

Encroachment by oxidation at the edges of lower nitride layer 36 can be substantially eliminated using the structure shown in FIG. 6B. After the oxidation patterning step, where portions of the conductive lower nitride layer 36 are converted to insulating regions 44, additional nitride layer 60, preferably silicon nitride having a thickness of approximately 300 Å to 2000 Å, is deposited over the upper surface structure. Following this, relatively thick dielectric 46 is deposited over the structure and flowed smooth by a high temperature reflow. As is well known in the art, the silicon nitride layer of upper nitride portions 40a and additional nitride layer 60 effectively block diffusion of oxygen and water vapor. Therefore, the addition of layer 60 to the structure prevents oxidation encroachment at the edges of patterned lower nitride layer 36 during the subsequent reflow process.

Alternatively, where the reflow cycle chosen is relatively short or the oxidizing ambient is limited to dry oxygen only, a process sequence may be used where patterning of the conductive lower nitride layer 36 by oxidation occurs simultaneously with the reflow of thick dielectric layer 46. In this alternative process sequence, the oxidation anneal used to pattern layer 36 and the additional nitride layer deposition (layer 60) are eliminated from the process sequence. Then oxidation or patterning of layer 36 will occur during the high temperature reflow cycle, where the time, temperature, ambient, and thick dielectric layer film thickness are selected to optimize both reflow and patterning requirements. A typical set of process conditions is for example: a 20 minute anneal at 850° C. using a 20%/80% $O_2/N_2$ ambient, and 8000 Å of BPSG.

Using upper nitride layers 40 and 60, preferably formed of silicon nitride, between the thick oxide and lower nitride layer 6, which is preferably titanium nitride, has the benefit of increasing the selectivity during etches. While both oxides and titanium nitride films are etched in fluorine-containing plasmas, the etch rate of silicon nitride, whether in the presence of or isolated from ion bombardment processes, tends to be about one-half that of densified CVD oxide. In the case of a stack of BPSG, for example, on silicon nitride on titanium nitride, the preferred plasma etch process will generally have the following sequence.

First, a low pressure, high power density step uses fluorocarbon gases at a partial pressure of 10–25% of the total chamber pressure, with the remaining component being a neutral component such as argon. The fluorocarbon gases can include carbon tetrafluoride $CF_4$, fluoroform or trifluoromethane $CHF_3$, hexafluoromethane or perfluoromethane $C_2F_6$, etc. These conditions insure a high energetic ion flux at the wafer surface and contribute to a high oxide etch rate. This step is continued until all of the oxide has been removed from the regions of the wafer where the oxide is thickest. Where the oxide is thinnest as a result of reflow processes or deposition non-uniformities, the underlying silicon nitride is etched at a reduced rate. The silicon nitride thickness originally deposited on the titanium nitride will be selected to provide sufficient thickness so as not to be breached at any location during this etch step. In the next or second etch step, the flow of the neutral component (argon) is reduced or eliminated. The chamber pressure is raised, and power density is reduced from the previous level. While these conditions are capable of continued etching of silicon nitride, they dramatically reduce the physical sputtering processes and thereby minimize the removal rate of titanium nitride at those locations where silicon nitride clears during the progress of the etch.

As a result of such a process, BPSG having a thickness from 6000 Å to 10,000 Å, for example, as a result of underlying topography and reflow processes, and silicon nitride at a thickness nominally of 2000 Å, for example, can be removed from a titanium nitride film having a thickness of approximately 500 Å without any appreciable reduction in the titanium nitride thickness at any location. Without using the silicon nitride, the underlying titanium nitride film would have been attacked by energetic ions at such locations where the BPSG was initially at its thinnest during approximately 40% of the total contact etch time.

In another embodiment of the present invention, another method for making contact to source/drain regions, field shield and gate polysilicon electrodes is now described. Reference is made to FIGS. 7, 8 and 9 which depict a shallow source/drain region to which contact will be made and a field shield polysilicon contact region. The depiction of the field shield contact, and the details of the procedures for executing this contact, apply similarly to the case in which contact will be made to a gate electrode.

Figure 7A:
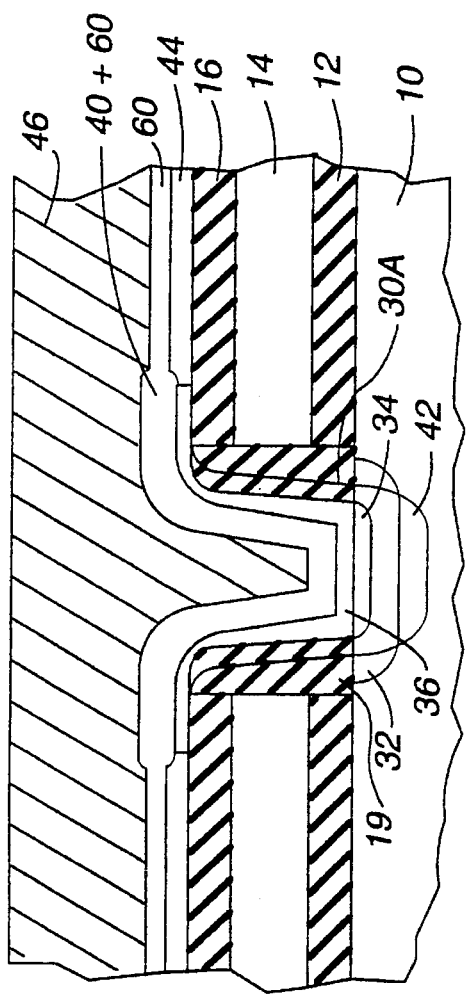
FIG. 7A illustrates a thick dielectric over a transistor structure and in a window to a source/drain region.
Figure 7B:
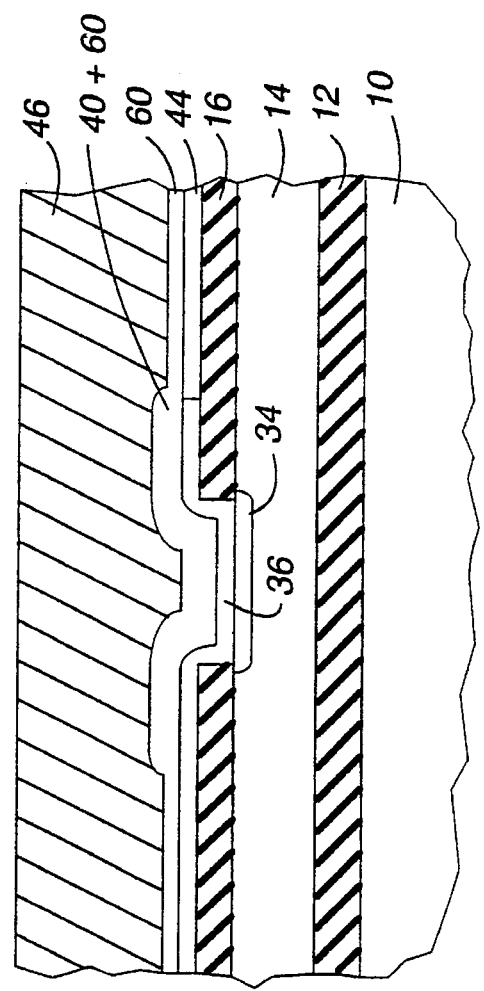
FIG. 7B illustrates a thick dielectric over a transistor structure and in a window to a gate electrode.

Due to differences in topography and the use of glass reflow processes, the thickness of the dielectric material 46 to be removed in the regions where source/drain contact is desired (FIG. 7A) can be up to twice as thick as that in the field shield and gate electrode regions (FIG. 7B). Conventional processing calls for these disparate contact regions to be defined in the same lithographic step and etched simultaneously. The present invention utilizes a modified etch chemistry which is selective to the two nitride layers under the thick dielectric layer (titanium nitride and silicon nitride). The net result of the two nitride layers and the modified etch chemistry is a contact etch process which has improved selectivity to underlying electrodes compared to contact etch processes which do not incorporate all of these features.

During conventional contact definition processes (i.e. in the absence of the nitride regions 36 and 40), the dielectric etch used to define the contacts terminates directly on the polysilicon in the field shield and gate electrode regions; this exposure of the polysilicon occurs while oxide is still present in the source/drain regions. During the extended etch times required to clear the dielectric 46 from these source/drain regions, the exposed polysilicon is attacked by the etching environment at the cost of a percentage of its original thickness. Depending on the relative thicknesses of the dielectric in the source/drain and polysilicon regions, and the original thickness of the polysilicon electrodes, the polysilicon loss due to over etch can have severe repercussions on device reliability and performance.

The plasma environments typically used to anisotropically etch silicon dioxide dielectrics (e.g., dielectric 46) commonly rely on fluorocarbon discharges. This plasma is generated by exposing a low-pressure gas phase reactant mixture of certain fluorocarbons (e.g., carbon tetrafluoride $CF_4$, fluoroform or trifluoromethane $CHF_3$, hexafluoroethane $C_2F_6$, etc.; frequently as a mixture with neutral components such as helium He and/or argon Ar) to a powerful confined radio frequency (rf) field. Ion bombardment flux and energies at the wafer's surface are controlled by the reactant mixture, the type and concentration of neutrals, the reaction chamber pressure, and the applied rf power, among other factors. Silicon dioxide dielectrics, such as 46, are etched anisotropically under conditions that favor a high flux of energetic ions at the wafer's surface. These high-bombardment reaction conditions are also capable of etching silicon nitride at a reduced rate (approximately 50% of that of silicon dioxide, under typical etching conditions); polysilicon is removed at about 20% of the oxide removal rate, and titanium nitride is removed at about 3% of the oxide etch rate (the selectivity, or relative etch rates, is approximately 33:1 under typical conditions). It is noted that, while both silicon dioxide and titanium nitride require a flux of energetic ions to etch anisotropically, both polysilicon and silicon nitride are capable of etching at high rates even in the absence of ion bombardment. These differences in etching behavior can be used to advantage in eliminating the attack of polysilicon during the extended etch times required to remove silicon dioxide from the thicker source/drain regions.

As a specific example, in FIGS. 7 through 9, the silicon dioxide dielectric 46 has a thickness of 9000 Å in the location where a contact to the source/drain region is desired (FIGS. 7A, 8A, 9A), but only 6000 Å where contact to a field shield polysilicon contact region (or gate electrode) is to be made (FIGS. 7B, 8B, 9B). The silicon nitride dielectric (layers 40 and 60) is 1500 Å in each location, and the titanium nitride (lower nitride layer 36) approximately 500 Å in each location.

In FIGS. 8A and 8B, a contact has been defined and partially etched in a plasma reaction designed to provide ion bombardment for rapid, anisotropic, silicon dioxide removal. Fig. 8A illustrates at a juncture when the etch time has been sufficient for the etch to remove the entire 9000 Å thickness of oxide 46 in the source/drain region but has not proceeded to etch the silicon nitride (layers 40 and 60) completely. FIG. 8B illustrates, at the location of contact to polysilicon contact region, how the same etch time for FIG. 8A results in the removal of both the 6000 Å oxide thickness and most or all of the silicon nitride. The silicon nitride removed is approximately half as thick as the excess oxide removed from the source/drain region (1500 Å v. 3000 Å), as a result of the 2:1 selectivity between these materials in the etch environment. The titanium nitride (layer 36 in FIG. 8B) over the polysilicon contact region is just exposed at this point in the process.

If the etch process is continued without modification, the remaining silicon nitride (layers 40 and 60 in FIG. 8A) is removed while the exposed titanium nitride in the polysilicon contact region (layer 36 in FIG. 8B) is subject to thinning by the high-ion-flux etching environment. The relative etch rates of silicon nitride and titanium nitride in an environment of this type is approximately 15:1 (i.e., in the time required to remove 1500 Å of silicon nitride from the source/drain contact region, approximately 100 Å of titanium nitride will be removed from the polysilicon contact region). In practice, the etch process is continued for some time beyond this just-clear condition in order to ensure that any nonuniformities in deposited dielectric thicknesses or etch rates are accounted for. The total titanium nitride loss in the source/drain contact region (FIG. 9A) may be approximately 100 Å after this "overetch" while the total loss of titanium nitride in the polysilicon contact region (FIG. 9B) may be approximately 200 Å. In any event, since a fraction of the original titanium nitride (approximately 500 Å) remains in each location, the polysilicon electrode is protected from any etch damage due to the extended etch.

In a further embodiment, the portion of the titanium nitride removed in both the source/drain and polysilicon contact regions can be further reduced. Rather than continuing the high-bombardment etch to remove the silicon nitride (layers 40 and 60) and expose the titanium nitride of layer 36 over the source/drain region (FIG. 8A), a second etch step at conditions leading to very low energetic ion flux may be employed. Modifications to the etch process leading to reduced ion bombardment include increased chamber pressure, reduction of the concentration of massive neutrals in the gas mixture (e.g., argon), reduction in rf power, changes in reactant ratios, and combinations of the above measures. As noted above, this reduction or elimination of ion bombardment does not necessarily reduce the rate at which silicon nitride is etched. However, the etch rates of silicon dioxide and titanium nitride are minimized.

Examples of modifications to the plasma etch reaction conditions, illustratively, include a) increase in reaction chamber pressure from less than 1 Torr to 2 Torr or greater; b) reduction of the concentration of massive neutrals such as argon from 50% volumetrically to 10% or less; c) reduction of applied rf power from 800 watts to 500 watts or less; d) modification of volummetric flow rate ratio of fluorine-saturated fluorocarbons (e.g., carbon tetrafluoride $CF_4$) to fluorine-unsaturated fluorocarbons (e.g., trifluoromethane $CHF_3$) from values of greater than 1:1 to values less than 1:1. The modifications above, taken individually or in combination, have the effect of significantly reducing the relative etch rates of silicon dioxide and titanium nitride with respect to the etch rate of silicon nitride.

The silicon nitride that remains in the source/drain contact can therefore be removed without significant attack of the titanium nitride exposed in polysilicon contact region. Furthermore, the titanium nitride in either contact region is not significantly thinned during the overetch. Polysilicon has not been attacked as a result of the extended overetch employed to clear thick silicon dioxide from the source/drain regions and, in this case, the titanium nitride exposed in neither the source/drain regions nor polysilicon contact areas (FIGS. 9A and 9B) suffers any significant reduction in thickness.

As a further embodiment, the contact etch process of the present invention, described above, can incorporate a wet or dry isotropic etch prior to the highly selective dry etch portion. The isotropic etch will provide a tapering of the thick dielectric sidewall resulting in improved metal (or other interconnect material) step coverage into the contact region.

While the preferred embodiment has been described herein, it will be apparent that various modifications can be made within the scope and spirit of the present invention which is defined by the following claims.

We claim:

1. In the fabrication of an integrated circuit transistor having an electrode to which electrical contact is to be made, the electrode being proximate to another structure of the integrated circuit to which electrical contact is not to be made and wherein said another structure is surrounded by dielectric layers, the process comprising the steps of:

establishing a first nitride layer that completely covers said electrode and overlies a first region that includes said electrode and said other structure, said first nitride layer and said electrode being formed by in-situ reaction of a deposited transition metal followed by reactive-sputter deposition of a transition metal nitride or refractory metal nitride;

establishing a second nitride layer over said first nitride layer;

patterning said second nitride layer to leave portions of said second nitride layer covering said electrode; and oxidizing said first nitride layer using said portions of said second layer as a mask, so that exposed portions of said first nitride layer are converted into an insulating layer.

2. The process according to claim 1 further comprising the steps of:

establishing an additional nitride layer over said first and second nitride layers, said additional nitride layer providing oxidation protection for said first nitride layer;

establishing a thick dielectric layer over said nitride layers;

performing a high temperature reflow anneal to said thick dielectric layer in an oxidizing ambient; and etching said thick dielectric layer and said nitride layers to open a widow over said electrode, so that a contact material can be place in said window to become electrically coupled to said electrode.

3. The process of claim 1 further comprising the steps of:

depositing a relatively thick dielectric over the entire structure before performing a high temperature reflow anneal in an oxidizing ambient to oxidize said first nitride layer using said portions of said second nitride layer as a mask, so that exposed portions of said first nitride layer are substantially converted into said insulating layer; and etching said relatively thick dielectric layer and said nitride layers to open a window over said electrode, so that a contact material can be placed in said window to become electrically coupled to said electrode.

4. The process according to claim 3 wherein said second nitride layer comprises silicon nitride and said first nitride layer comprises titanium nitride and said step of etching said window through said thick dielectric layer uses plasma etch conditions which favor a rapid etch rate through silicon oxide as a first etch step;

said process further comprising the step of etching through said second nitride layer to said first nitride layer using a second plasma etch condition which has extremely high etch selectivity between said first and second nitride layers.

5. The process according to claim 1 further comprising the step of implanting a high concentration of impurities into said electrode after establishing said first and second nitride layers so that a resulting impurity region is offset from adjacent structures in an amount corresponding to the thickness of said first and second nitride layers.

6. The process of claim 1 wherein said first region has sidewalls, said process further comprising the step of establishing a dielectric spacer on said sidewalls of said first region prior to establishing said first nitride layer.

7. The process of claim 1 further comprising the step of forming a local interconnect with titanium nitride as an electrical connection to an element selected from the group consisting of a transistor source, drain and gate region.

8. In the fabrication of an integrated circuit transistor having an electrode to which electrical contact is to be made, the electrode being proximate to another structure of the integrated circuit to which electrical contact is not to be made and wherein said another structure is surrounded by dielectric layers, a process comprising the steps of:

establishing a first nitride layer that completely covers the electrode and overlies a first region that includes the electrode and the other structure, the first nitride layer and the electrode being formed by in-situ reaction of a deposited transition metal followed by reactive-sputter deposition of a transition metal nitride or refractory metal nitride;

establishing a second nitride layer over the first nitride layer patterning the second nitride layer to leave portions of the second nitride layer covering the electrode; and oxidizing the first nitride layer using the portions of said second layer as a mask, so that the exposed portions of the first nitride layer are converted into an insulative layer and;

establishing an additional nitride layer over said first and second nitride layers, said additional nitride layer providing oxidation protection for said first nitride layer;

depositing a thick dielectric layer over said nitride layers;

performing a high temperature reflow anneal to said thick dielectric layer in an oxidizing ambient;

etching said thick dielectric layer and nitride layers to open a window over said electrode, so that a contact material can be placed in said window to become electrically coupled to said electrode;

depositing a conductive refractory material such that it becomes electrically coupled to said electrode, patterning said conductive refractory material by photolithography and etching to form a conductive interconnect layer;

depositing an additional thick dielectric layer over said conductive refractory material;

performing a high temperature reflow anneal to said additional thick dielectric layer an oxidizing or non-oxidizing ambient;

etching said additional thick dielectric layer to open a window over said conductive refractory interconnect; and depositing and patterning a final conductive interconnect layer.

9. The process according to claim 8 where said conductive refractory material is titanium nitride.

10. The process according to claim 8 where the conductive refractory material is a titanium tungsten alloy.

11. The process according to claim 8 where the conductive refractory material is a silicide material from the group consisting of tungsten silicide, molybdenum silicide, platinum silicide, or titanium silicide.

* * * * *